United States Patent
Parthasarathy et al.

(10) Patent No.: US 12,073,899 B2
(45) Date of Patent: *Aug. 27, 2024

(54) TRACK CHARGE LOSS BASED ON SIGNAL AND NOISE CHARACTERISTICS OF MEMORY CELLS COLLECTED IN CALIBRATION OPERATIONS

(71) Applicant: Micron Technology, Inc., Boise, ID (US)

(72) Inventors: Sivagnanam Parthasarathy, Carlsbad, CA (US); James Fitzpatrick, Laguna Niguel, CA (US); Patrick Robert Khayat, San Diego, CA (US); AbdelHakim S. Alhussien, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/536,462

(22) Filed: Nov. 29, 2021

(65) Prior Publication Data

US 2022/0084614 A1 Mar. 17, 2022

Related U.S. Application Data

(63) Continuation of application No. 16/988,360, filed on Aug. 7, 2020, now Pat. No. 11,227,666.

(51) Int. Cl.
*G11C 29/12* (2006.01)
*G06F 18/214* (2023.01)
*G06N 20/00* (2019.01)
*G11C 7/02* (2006.01)
*G11C 29/14* (2006.01)
*G11C 29/44* (2006.01)

(52) U.S. Cl.
CPC ...... *G11C 29/12005* (2013.01); *G06F 18/214* (2023.01); *G06N 20/00* (2019.01); *G11C 7/02* (2013.01); *G11C 29/14* (2013.01); *G11C 29/44* (2013.01)

(58) Field of Classification Search
CPC ..... G11C 29/12005; G11C 29/14; G11C 7/02; G11C 29/44; G06N 20/00; G06K 9/6256
See application file for complete search history.

(56) References Cited

U.S. PATENT DOCUMENTS

| | | | |
|---|---|---|---|
| 11,227,666 B1 | 1/2022 | Parthasarathy et al. | |
| 2015/0332780 A1* | 11/2015 | Jang | G11C 16/0483 365/185.18 |
| 2015/0357043 A1* | 12/2015 | Im | G11C 16/28 365/185.11 |
| 2022/0044751 A1 | 2/2022 | Parthasarathy et al. | |

* cited by examiner

*Primary Examiner* — Ajay Ojha
(74) *Attorney, Agent, or Firm* — Greenberg Traurig

(57) ABSTRACT

A memory sub-system to track charge loss in memory cells and shifts of voltages optimized to read the memory cells. For example, a memory device can measure signal and noise characteristics of a group of memory cells to calculate an optimized read voltage of the group of memory cells. The memory sub-system having the memory device can determine an amount of charge loss in the group of memory cells, using at least the signal and noise characteristics, the optimized read voltage, and/or the bit error rate of data read using the optimized read voltage. The memory sub-system tracks changes in optimized read voltages of memory cells in the memory device based on the amount of charge loss.

20 Claims, 8 Drawing Sheets

TRACK CHARGE LOSS BASED ON SIGNAL AND NOISE CHARACTERISTICS OF MEMORY CELLS COLLECTED IN CALIBRATION OPERATIONS

RELATED APPLICATIONS

The present application is a continuation application of U.S. patent application Ser. No. 16/988,360 filed Aug. 7, 2020, the entire disclosures of which application are hereby incorporated herein by reference.

TECHNICAL FIELD

At least some embodiments disclosed herein relate to memory systems in general, and more particularly, but not limited to memory systems configured to determine charge loss based at least in part on signal and noise characteristics of memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
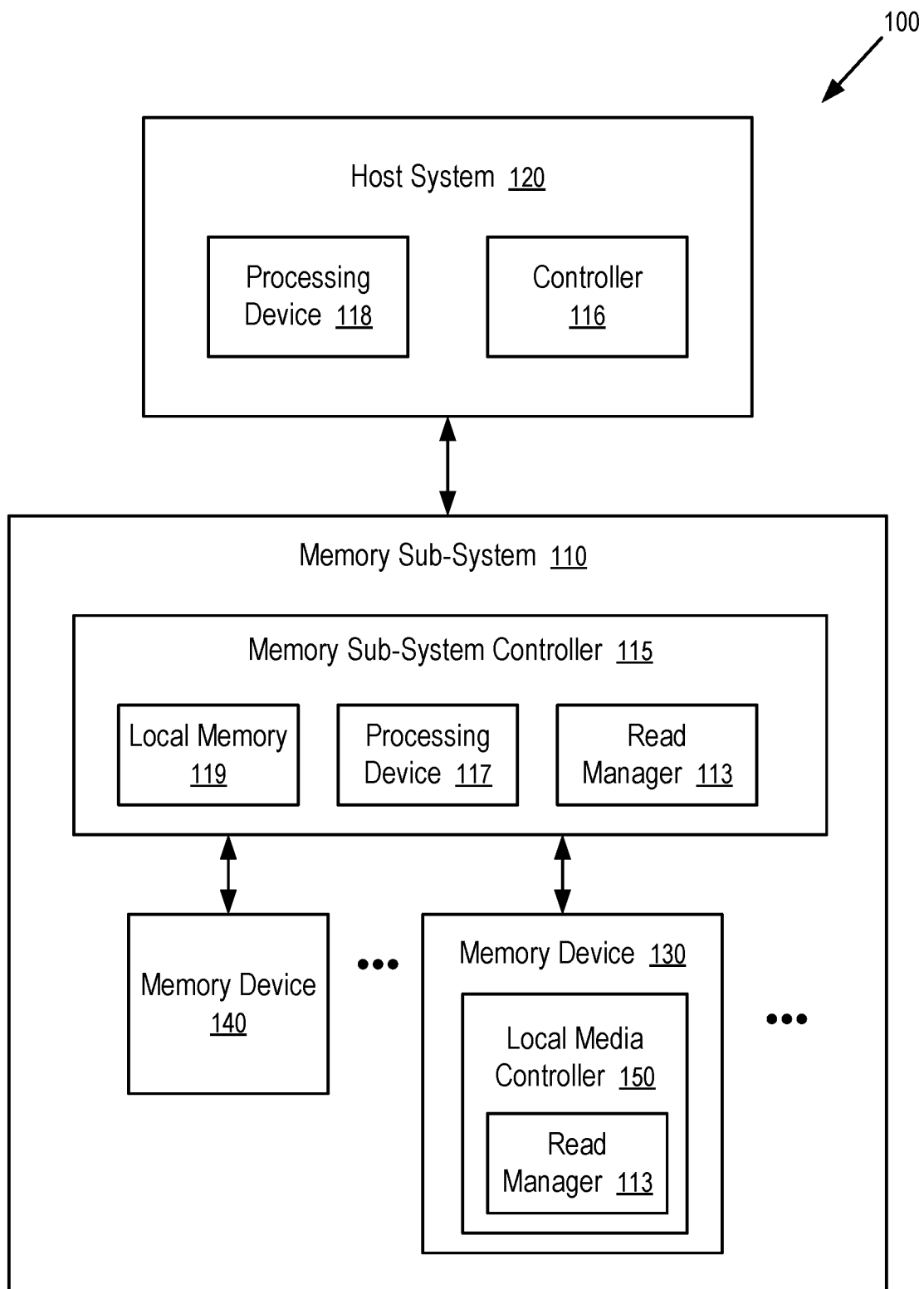
FIG. 1 illustrates an example computing system having a memory sub-system in accordance with some embodiments of the present disclosure.

At least some aspects of the present disclosure are directed to a memory sub-system configured to track charge loss based on signal and noise characteristics measured during calibrations of read voltages of the group of memory cells. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in raw, encoded data retrieved from the memory sub-system and/or recover the original, non-encoded data that is used to generated encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

When the encoded data retrieved from the memory cells of the memory sub-system has too many errors for successful decoding, the memory sub-system may retry the execution of the read command with adjusted parameters for reading the memory cells. However, it is inefficient to search for a set of parameters through multiple read retry with multiple rounds of calibration, reading, decoding failure, and retry, until the encoded data retrieved from the memory cells can be decoded into error free data. For example, blind searching for the optimized read voltages is inefficient. For example, one or more commands being injected between retry reads can lead to long latency for recovering data from errors.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by determining an amount of charge loss in a group of memory cells based at least in part on the signal and noise characteristics of memory cells measured during the calibration of the optimized read voltages of the group of memory cells, and tracking the amount of charge loss to determine estimates of optimized read voltages as a starting point in a subsequent calibration of the optimized read voltages of the group of memory cells, or another group of memory cells.

Charge loss can cause the optimized read voltages of a memory cell to shift in a systematic way. In the absence of other factors that cause shifts or changes in the optimized read voltages of the memory cell, the amount of charge loss in a group of memory cells correlates with the highest threshold voltage and the optimized read voltages at different levels for reading a memory cell that is programmed to store multiple bits data.

Based on the correlation between the highest threshold voltage and shifts in the optimized read voltages at different levels (e.g., caused by charge loss), a look up table can be configured to provide estimates of optimized read voltages at the different levels for reading the memory cell based on an estimate of the range of the highest threshold voltage. The estimates of the optimized read voltages determined in such a way can be used as the result of a coarse calibration of the read voltages of the memory cell. A fine calibration can be performed to capture further shifts in optimized read voltages that may be caused by other factors, such as read disturb, cross-temperature effect, etc.

The highest threshold voltage can be estimated during a read sensing operation in a memory device (e.g., the dynamic voltage for controlling the gate of memory cells during read, or dynamic VpassR). However, such an estimate can be inaccurate in many circumstances. For example, when a block is written over the course of a long period of time (e.g., an hour), different groups of memory cells can have different shifts in their highest threshold voltages, since the shifts depend upon when the word line in the block is written. Thus, the memory device may not be able to accurately sense the highest threshold voltage of a group of memory cells.

In at least some embodiments disclosed herein, the amount of charge loss in a group of memory cells is computed or estimated using at least the signal and noise characteristics measured during the fine calibration of the optimized read voltages. The amount of charge loss can be determined by applying the measured signal and noise characteristics as input to a predictive model. The predictive model can further use additional inputs, such as the optimized read voltage calibrated at the highest level of read voltages of the group of memory cells and/or optimized read voltages at other levels, a count of bit errors identified in the results of memory data that is retrieved from the group of memory cells using the optimized read voltages. Amounts of charge loss can be tracked to facilitate the determination of estimates of optimized read voltages in coarse calibration.

For a given estimate of an optimized read voltage, a memory device can automatically perform a fine calibration of the optimized read voltage by measuring signal and noise characteristics of a group of memory cells. The signal and noise characteristics measured for memory cells can be based on a bit count of memory cells in the group having a predetermined status when a test voltage is applied to read the memory cells. Different test voltages near the given estimate of the optimized read voltage and separated from one another by a predetermined voltage interval or gap can have different bit counts. The difference between bit counts of two adjacent test voltages provides the count difference for the voltage interval or gap between the adjacent test voltages. An optimized read voltage can be found at a voltage where the distribution of the count differences over voltage reaches a minimum.

To improve efficiency and accuracy, the range of the test voltages is typically configured to be small in comparison to the possible range of the optimized read voltage. To increase the chance that the optimized read voltage to be determined is located within the test voltage range, the test voltage range for measuring the signal and noise characteristics in the determination of the fine calibration of the optimized read voltage is configured to be centered at the given estimate of the optimized read voltage (e.g., the coarse calibration of the optimized read voltage). Such a coarse calibration can be determined, for example, from the look up table based on the estimate of the highest threshold voltage.

A predictive model can be used to compute/estimate/predict the charge loss in the group of memory cells based on the signal and noise characteristics of the group of memory cells. For example, the input to the predictive model can include the count differences measured on the test voltage ranges at the different read voltage levels, the optimized read voltage(s) calculated from the count differences, and a count of bit errors detected during the decoding of the memory data obtained according to the optimized read voltages. The decoding can be performed using an error detection and data recovery technique, such as Error Correction Code (ECC), Low-Density Parity-Check (LDPC) code, etc. Optionally, the count of bit errors can also be estimated from the count differences so that the charge loss can be computed/estimated without reading the memory cells at the optimized read voltages to retrieve memory data and/or without decoding the memory data retrieved using the optimized read voltages.

The predictive model for the computing of the charge loss amount can be obtained using a machine learning technique, or another technique, such as statistical analysis, correlation, classification tree, etc.

In one embodiment, the predictive model is configured to compute an estimated amount of charge loss from the count differences measured for the highest read voltage (e.g., the read voltage at the highest level of reading the group of memory cells), the highest optimized read voltage, and the count of bit errors detected during the decoding of the memory data retrieved using the optimized read voltages. In other embodiments, the predictive model is configured to further use count differences measured for other lower read voltage levels and/or the lower optimized read voltages as part of the input to compute the estimated amount of charge loss.

An amount of charge loss can be used as, or mapped into, an index usable in a table to look up the estimated read voltage of a group of memory cells having the amount of charge loss. The estimated read voltage can be at the highest read voltage level of the group of memory cells. Optionally, the table can also provide estimated read voltages at other lower voltage levels for reading the group of memory cells. The estimates obtained from the table according to the amount of charge loss can be used as a coarse calibration of the read voltages of the group of memory cells.

A memory sub-system 110 can store data identifying time pools of memory cells. Each time pool identifies a set of memory cell groups that have similar amounts of charge loss (e.g., within a threshold from a nominal amount of charge loss). Thus, the optimized read voltages of the time pool can be used as the coarse calibration of the optimized read voltages of any group in the time pool.

In general, charge loss in a group of memory cells during a period of time depends not only the length of the period but also the temperature of the memory cells during the period of time. For a given amount of charge loss, the nominal length of a time period for the memory cells to accumulate, under a predetermined, nominal condition (e.g., temperature), the given amount of charge loss can be calculated. Such a nominal length can be different from the actual time period that causes the given amount of charge loss, because the actual temperature of the memory cells may be different from the temperature in the predetermined, nominal condition.

In one embodiment, the time pools are configured based on the nominal time lengths of memory cells from their last write operations. Thus, the time lengths tracked from the time pools are normalized according to the predetermined, nominal condition (e.g., a predetermined temperature of memory cells).

The amount of charge loss determined from the predictive model according to the signal and characteristics of memory cells can be used to determine a nominal time length for the amount of charge loss under the predetermined, nominal condition. Thus, the time lengths of the time pools can be tracked accurately under the predetermined, nominal condition, while the actual condition of the group of memory cell can vary from time to time.

For example, when a memory sub-system 110 is powered off for a period of time, the actually time period during which the memory sub-system 110 is powered off can be different from the nominal time length of charge loss under the predetermined, nominal condition (e.g., a predetermined temperature). The actually time period along is insufficient for the estimate of charge loss during the time period, because the charge loss is also dependent on the temperature history of the memory cells during the time period. The actual temperature history of the memory cells generally deviates from the predetermined temperature. Since the actual temperature history is generally unknown, it is difficult to obtain an estimate of the charge loss based on the actual time length of the power off period. However, the amounts of charge loss in the group of memory cells before and after the power off period can be estimated from the signal and noise characteristics of the group of memory cells before and after the power off period. The difference between the amounts of charge loss in the group of memory cells before and after the power off period can be used to identify the nominal time length of the additional amount of charge loss accumulated under the predetermined, nominal condition (e.g., a predetermined temperature) during the power off period. This nominal time length can be used to update the time pool that includes the group, but also other time pools.

For example, after the memory sub-system 110 is powered on following the power off period, the amount of charge loss determined from the predictive model according to the signal and characteristics of memory cells can be used to determine a nominal time length for the amount of charge loss under the predetermined, nominal condition. This nominal time length of the charge loss amount at the time of powering on can be compared to the corresponding nominal time length of the charge loss amount at the time of powering off. Thus, the nominal time duration of charge loss during the power off period can be determined and used to update the time lengths of the time pools. Optionally, such a nominal time duration of charge loss during the power off period can be computed for each of multiple memory cell groups; and an average of the nominal time lengths of the groups can be used to update the time pools.

In general, the amounts of charge loss determined from the predictive model for a group of memory cells at two different time instances can be used to calculate the nominal time duration of charge loss between the two time instances. The nominal time duration can be used to update the time pools of memory cells to track their charge loss.

In some instances, different groups of memory cells in the memory sub-system 110 can have different temperatures during operation. As result, the different groups can have different rates in accumulating charge loss. Such groups can be assigned to different time pools even through data may be written into the memory cells approximately at the same time. For example, after the amount of charge loss is determined from the predictive model during the execution of a read or calibration command for a group, the nominal time of writing the data into the group to accumulate the amount of charge loss under the predetermined, nominal condition can be calculated to assign the group to a time pool associated with the nominal time of writing. Thus, the optimized read voltages of the group of memory cells can be tracked in association with the time pool.

After count differences are measured on a test voltage range, the memory device can calculate an optimized read voltage from the count differences in the test voltage range.

For example, when one of the count differences in the test voltage range is smaller than its two adjacent neighbors, the minimum corresponding to the optimized read voltage can be considered to be in the voltage interval or gap of the smallest count difference. An improved location of the optimized read voltage within the gap can be computed based on a ratio of adjacent neighbors, as further discussed below in connection with FIG. 5.

For example, when no count difference is between two higher adjacent neighbors in a test voltage range, the optimized read voltage can be identified as in a voltage interval or gap corresponding to a count difference that is smaller than two of the next two count differences. An improved location of the optimized read voltage within the gap can be computed based on a ratio of bit counts at the test voltages of the two ends of the gap, as further discussed below in connection with FIG. 6.

After an optimized read voltage is calculated (e.g., using techniques illustrated in FIGS. 3-6), the memory device can use the optimized read voltage to read memory cells and obtain hard bit data, and optionally boost modulating the applied read voltage(s) to adjacent voltages to further read the memory cells for soft bit data.

Preferably, the operations of reading the hard bit data and reading the soft bit data are scheduled together during the execution of the read command to minimize the time required to obtain the soft bit data and/or to avoid delay that can be caused by processing a separate read command, or by intervening operations on the memory cells.

Optionally, the signal and noise characteristics measured for memory cells are further used to evaluate the quality of the hard bit data retrieved using the calibrated read voltage(s). The evaluation can be performed at least in part concurrently with the reading of the hard bit data. Based on the evaluated quality of the hard bit data, the memory device may selectively read and/or transmit the soft bit data.

The hard bit data retrieved from a group of memory cells using the calibrated/optimized read voltage can be decoded using an error detection and data recovery technique, such as Error Correction Code (ECC), Low-Density Parity-Check (LDPC) code, etc. When the error rate in the hard bit data is high, the soft bit data, retrieved from the memory cell using read voltages with predetermined offsets from the calibrated/optimized read voltage, can be used to assist the decoding of the hard bit data. When the soft bit data is used, the error recovery capability is improved in decoding the hard bit data.

Optionally, a controller of a memory sub-system can initially send a command to a memory device to read hard bit data with calibrated read voltage; and in response to a failure in the decoding of the hard bit data, the controller can further send a command to the memory device to read the corresponding soft bit data. Such an implementation is efficient when the likelihood of a failure in decoding the hard bit data without soft bit data is lower than a threshold. However, when the likelihood is above the threshold, the overhead of sending the separate command becomes disadvantageous.

When the likelihood of using soft bit data is above a threshold, it is advantageous to transmit a single command to the memory device to cause the memory device to read the soft bit data and the hard bit data together. Further, the memory device can use the signal and noise characteristics of the memory cells to predict whether the soft bit data is likely to be used by the controller. If the likelihood of using of the soft bit data is lower than a threshold, the memory device can skip reading the soft bit data.

For example, during the calibration operation, the memory device can measure the signal and noise characteristics of the memory cells and use the measurements to calculate an optimized/calibrated read voltage for reading the memory cells. Once the optimized/calibrated read voltage is obtained, the memory device reads the memory cells to obtain the hard bit data. Subsequently, the memory device adjusts the already applied optimized/calibrated read voltage (e.g., through boosted modulation) to a predetermined offset (e.g., 50 mV) below the optimized/calibrated read voltage to retrieve a set of data, and further adjusts the currently applied voltage (e.g., through boosted modulation) to the predetermined offset above the optimized/calibrated read voltage to retrieve another set of data. The logic operation of XOR (exclusive or) of the two sets of data at the both sides of the offset (e.g., 50 mV) from the optimized/calibrated read voltage provides the indication of whether the memory cells provide the same reading at the offset locations around the optimized/calibrated read voltage. The result of the XOR operation can be used as soft bit data for decoding the hard bit data read using the optimized/calibrated read voltage. In some implementations, a larger offset (e.g., 90 mV) can be used to read another set of soft bit data that indicates whether the memory cells provide the same reading at the locations according to the larger offset (e.g., 90 mV) around the optimized/calibrated read voltage.

For example, in response to a read command from a controller of the memory sub-system, a memory device of the memory sub-system performs an operation to calibrate a read voltage of memory cells. The calibration is performed by measuring signal and noise characteristics through reading the memory cells at a number of voltage levels that are near an estimated location of the optimized read voltage. An optimized read voltage can be calculated based on statistical data of the results generated from reading the memory cells at the voltage levels. For example, the statistical data can include and/or can be based on counts measured by calibration circuitry at the voltage levels. Optionally, such signal and noise characteristics can be measured for sub-regions in parallel to reduce the total time for measuring the signal and noise characteristics. The statistical data of the results generated from reading the memory cells at the voltage levels can be used to predict whether the decoding of the hard bit data retrieved using the optimized read voltage is likely to require the use of soft bit data for successful decoding. Thus, the transmission of the soft bit data can be performed selectively based on the prediction.

For example, a predictive model can be generated through machine learning to estimate or evaluate the quality of data that can be retrieved from a set of memory cells using the calibrated/optimized read voltage(s). The predictive model can use features calculated from the measured signal and noise characteristics of the memory cells as input to generate a prediction. The reading and/or transmission of the soft bit data can be selectively skipped based on the prediction.

After the memory device reads the group of memory cells to obtain hard bit data and/or soft bit data, an error detection and data recovery technique is applied to determine a set of error-free data and a count of bit errors in the hard bit data. The count of bit errors, the optimized read voltages and/or the count differences measured to determine the optimized read voltages can be provided to a predictive model configured to compute/estimate the total amount of charge loss in the group of memory cells. The computed amount of charge loss can be tracked for a subsequent coarse calibration of read voltages.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, am embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller).

The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a read manager 113 configured to estimate an amount of charge loss in a group of memory cells using signal and noise characteristics of the group of memory cells measured during the calibration of an optimized read voltage of the group of memory cells and track the estimate charge loss to estimate optimized read voltages in a subsequent calibration. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (processor) of the host system 120, can be configured to execute instructions stored in memory for performing the operations of the read manager 113 described herein. In some embodiments, the read manager 113 is implemented in an integrated circuit chip disposed in the memory sub-system 110. In other embodiments, the read manager 113 can be part of firmware of the memory sub-system 110, an operating system of the host system 120, a device driver, or an application, or any combination therein.

For example, the read manager 113 implemented in the controller 115 can transmit a read command or a calibration command to the memory device 130. In response to such a command, the read manager 113 implemented in the memory device 130 is configured to measure signal and noise characteristics of a group of memory cells by reading the group of memory cells at a plurality of test voltages configured near an estimated location of the optimized read voltage for the group of memory cells. The test voltages can be configured to be equally spaced by a same amount of voltage gap. A result of reading the group of memory cells at a test voltage determines a bit count of memory cells in the group that are determined to be storing or reporting a predetermined bit (e.g., 0 or 1 corresponding to memory cells being conductive or non-conductive at the test voltage) when the group is read at the test voltage. A count difference can be computed from the bit counts of each pair of adjacent test voltages. Based on the count differences measured in the test voltage range, the read manager 113 computes an optimized read voltage for reading hard bit data from the group of memory cells and optionally determines a voltage window for reading corresponding soft bit data for the decoding of the hard bit data. The memory device 130 can determine a bit error rate in the hard bit data from decoding the hard bit data. Alternatively, the memory device 130 can estimate the bit error rate in the hard bit data using the count differences. The count differences, the optimized read voltages, and the bit error rate can be used as an input to a predictive model to compute the amount of charge loss in the group of memory cells. The amount of charge loss identifies a nominal time of accumulating charge loss under a predetermined, nominal condition (e.g., temperature) and shifts in optimized read voltages resulting from the amount of charge loss. The nominal time and the shifts can be used to facilitate the estimation of optimized read voltages of the group of memory cells or another group of memory cells having a similar nominal time.

Figure 2:
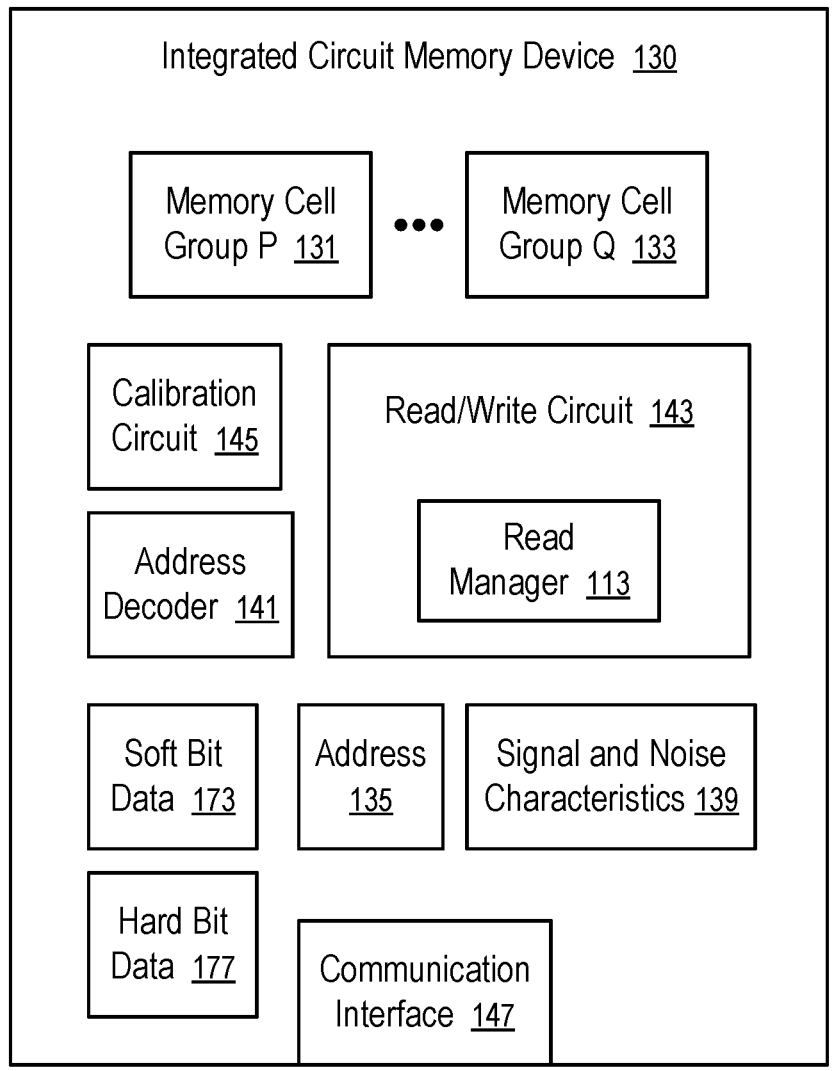
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, . . . , 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve both hard bit data 177 and soft bit data 173 from the memory address 135, and provide at least the hard bit data 177 as a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the hard bit data 177 and the soft bit data 173 of memory cells at the address 135.

The integrated circuit memory device 130 has a calibration circuit 145 configured to determine measurements of signal and noise characteristics 139 of memory cells in a group (e.g., 131, . . . , or 133). For example, the statistics of memory cells in a group or region that has a particular state at one or more test voltages can be measured to determine the signal and noise characteristics 139. Optionally, the signal and noise characteristics 139 can be provided by the memory device 130 to the controller 115 of a memory sub-system 110 via the communication interface 147.

In at least some embodiments, the calibration circuit 145 determines the optimized read voltage(s) of the group of memory cells based on the signal and noise characteristics 139. In some embodiments, the signal and noise characteristics 139 are further used in the calibration circuit 145 to determine whether the error rate in the hard bit data 177 is sufficiently high such that it is preferred to decode the hard bit data 177 in combination with the soft bit data 173 using a sophisticated decoder. When the use of the soft bit data 173 is predicted, based on the prediction/classification of the error rate in the hard bit data 177, the read manager 113 can transmit both the soft bit data 173 and the hard bit data 177 to the controller 115 of the memory sub-system 110.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the hard bit data 177 and the soft bit data 173 from the address 135. Since the signal and noise characteristics 139 is measured as part of the operation to read the hard bit data 177 from the address 135, the signal and noise characteristics 139 can be used in the read manager 113 with reduced or no penalty on the latency in the execution of the command to read the hard bit data 177 from the address 135.

The read manager 113 of the memory device 130 is configured to use the signal and noise characteristics 139 to determine the voltages used to read memory cells identified by the address 135 for both hard bit data and soft bit data and to determine whether to transmit the soft bit data to the memory sub-system controller 115.

For example, the read manager 113 can use a predictive model, trained via machine learning, to predict the likelihood of the hard bit data 177 retrieved from a group of memory cells (e.g., group 131 or 133) failing a test of data integrity. The prediction can be made based on the signal and noise characteristics 139. Before the test is made using error-correcting code (ECC) and/or low-density parity-check (LDPC) code, or even before the hard bit data 177 is transferred to a decoder, the read manager 113 uses the signal and noise characteristics 139 to predict the result of the test. Based on the predicted result of the test, the read manager 113 determines whether to transmit the soft bit data to the memory sub-system controller 115 in a response to the command.

For example, if the hard bit data 177 is predicted to decode using a low-power decoder that uses hard bit data 177 without using the soft bit data 173, the read manager 113 can skip the transmission of the soft bit data 173 to the memory sub-system controller 115; and the read manager 113 provides the hard bit data 177, read from the memory cells using optimized read voltages calculated from the signal and noise characteristics 139, for decoding by the low-power decoder. For example, the low-power decoder can be implemented in the memory sub-system controller 115. Alternatively, the low-power decoder can be implemented in the memory device 130; and the read manager 113 can provide the result of the lower-power decoder to the memory sub-system controller 115 as the response to the received command.

For example, if the hard bit data 177 is predicted to fail in decoding in the low-power decoder but can be decoded using a high-power decoder that uses both hard bit data and soft bit data, the read manager 113 can decide to provide both the hard bit data 177 and the soft bit data 173 for decoding by the high-power decoder. For example, the high-power decoder can be implemented in the controller 115. Alternatively, the high-power decoder can be implemented in the memory device 130.

Optionally, if the hard bit data 177 is predicted to fail in decoding in decoders available in the memory sub-system 110, the read manager 113 can decide to skip transmitting the hard bit data 177 to the memory sub-system controller 115, initiate a read retry immediately, such that when the memory sub-system controller 115 requests a read retry, at least a portion of the read retry operations is performed to reduce the time for responding to the request from the memory sub-system controller 115 for a read retry. For example, during the read retry, the read manager 113 instructs the calibration circuit 145 to perform a modified calibration to obtain a new set of signal and noise characteristics 139, which can be further used to determine improved read voltages.

The data from the memory cells identified by the address (135) can include hard bit data 177 and soft bit data 173. The hard bit data 177 is retrieved using optimized read voltages. The hard bit data 177 identifies the states of the memory cells that are programmed to store data and subsequently detected in view of changes caused by factors, such as charge loss, read disturb, cross-temperature effect (e.g., write and read at different operating temperatures), etc. The soft bit data 173 is obtained by reading the memory cells using read voltages centered at each optimized read voltage with a predetermined offset from the center, optimized read voltage. The XOR of the read results at the read voltages having the offset indicates whether the memory cells provide different read results at the read voltages having the offset. The soft bit data 173 can include the XOR results. In some instances, one set of XOR results is obtained based on a smaller offset; and another set of XOR results is obtained based on a larger offset. In general, multiple sets of XOR results can be obtained for multiple offsets, where each respective offset is used to determine a lower read voltage and a higher read voltage such that both the lower and higher read voltages have the same respective offset from an optimized read voltage to determine the XOR results.

Figure 3:
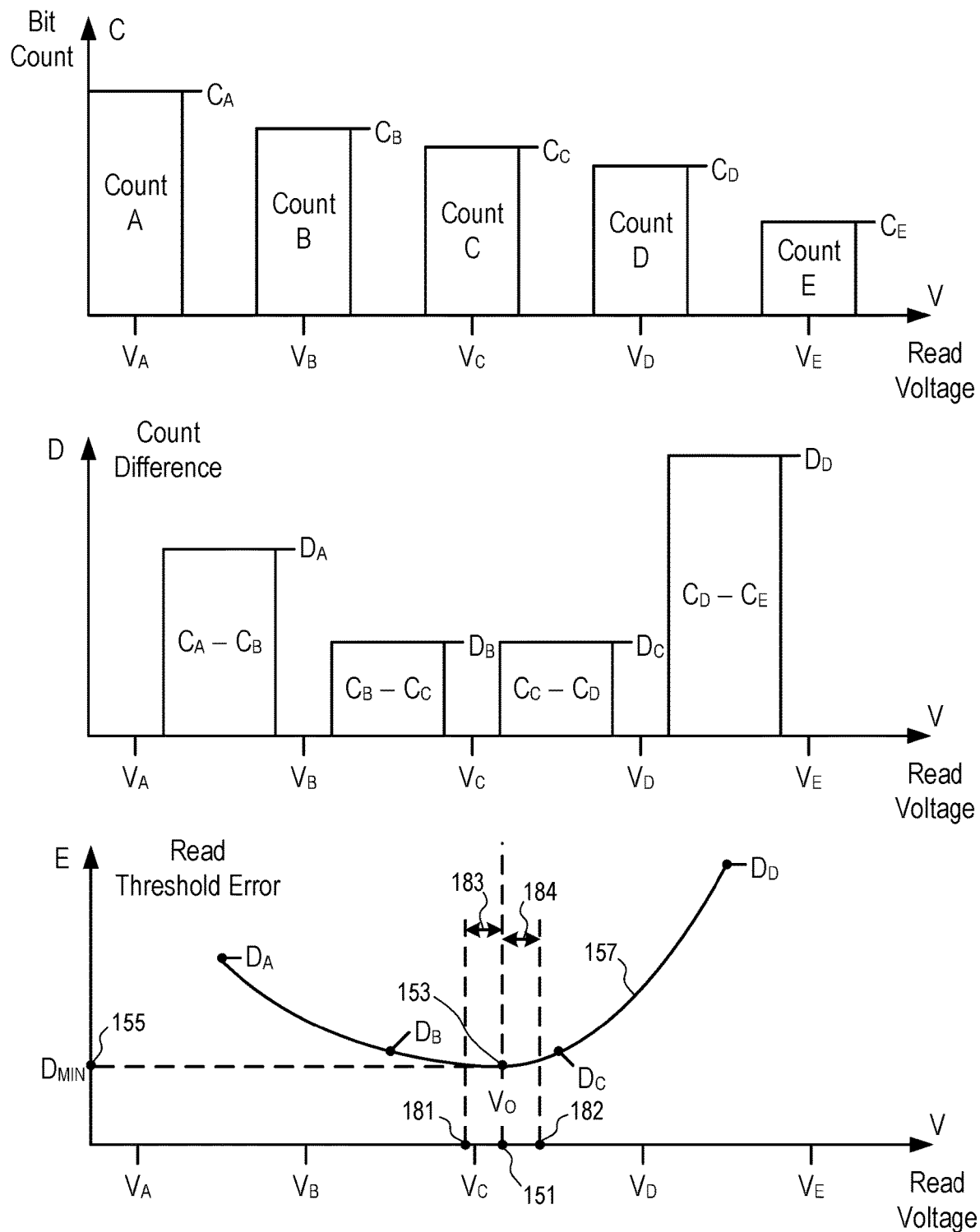
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, ..., or 133). In general, more or less read voltages can be used to generate the signal and noise characteristics 139.

As a result of the different voltages applied during the read operation, a same memory cell in the group (e.g., 131, ..., or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, ..., or 133) of memory cells.

Alternatively, the group (e.g., 131, ..., or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, ..., or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data from the address 135 that is mapped to one or more memory cells in the group (e.g., 131, ..., or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, ..., or 133).

For example, the count difference $D_A$ is calculated from $C_A-C_B$, which is an indication of read threshold error introduced by changing the read voltage from $V_A$ to $V_B$.

Similarly, $D_B=C_B-C_C$; $D_C=C_C-C_D$; and $D_D=C_D-C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimized read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the data according to the determined states.

During the read operation, the calibration circuit 145 of the memory device 130 generates the signal and noise characteristics 139. The data and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data 177 in the data from the memory cells at the address 135. The soft bit data in the data can be obtained by reading the memory cells with read voltages that are a predetermined offset away from the optimized read voltage $V_O$. Alternatively, the memory device 130 uses the controller-specified read voltage provided in the read control parameter in reading the data.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 110 that receives the signal and noise characteristics 139 as part of enriched status response from the memory device 130.

The hard bit data 177 can be obtained by applying the optimized read voltage $V_O$ on the group of memory cells and determining the state of the memory cells while the memory cells are subjected to the optimized read voltages $V_O$.

The soft bit data 173 can be obtained by applying the read voltages 181 and 182 that are offset from the optimized read voltage $V_O$ with a predetermined amount. For example, the read voltage 181 is at the offset 183 of the predetermined amount lower from the optimized read voltage $V_O$; and the read voltage 182 is at the offset 184 of the same predetermined amount higher from the optimized read voltage $V_O$. A memory cell subjected to the read voltage 181 can have a state that is different from the memory cell subjected to the read voltage 182. The soft bit data 173 can include or indicate the XOR result of the data read from the memory cell using the read voltages 181 and 182. The XOR result shows whether the memory cell subjected to the read voltage 181 has the same state as being to the read voltage 182.

Figure 4:
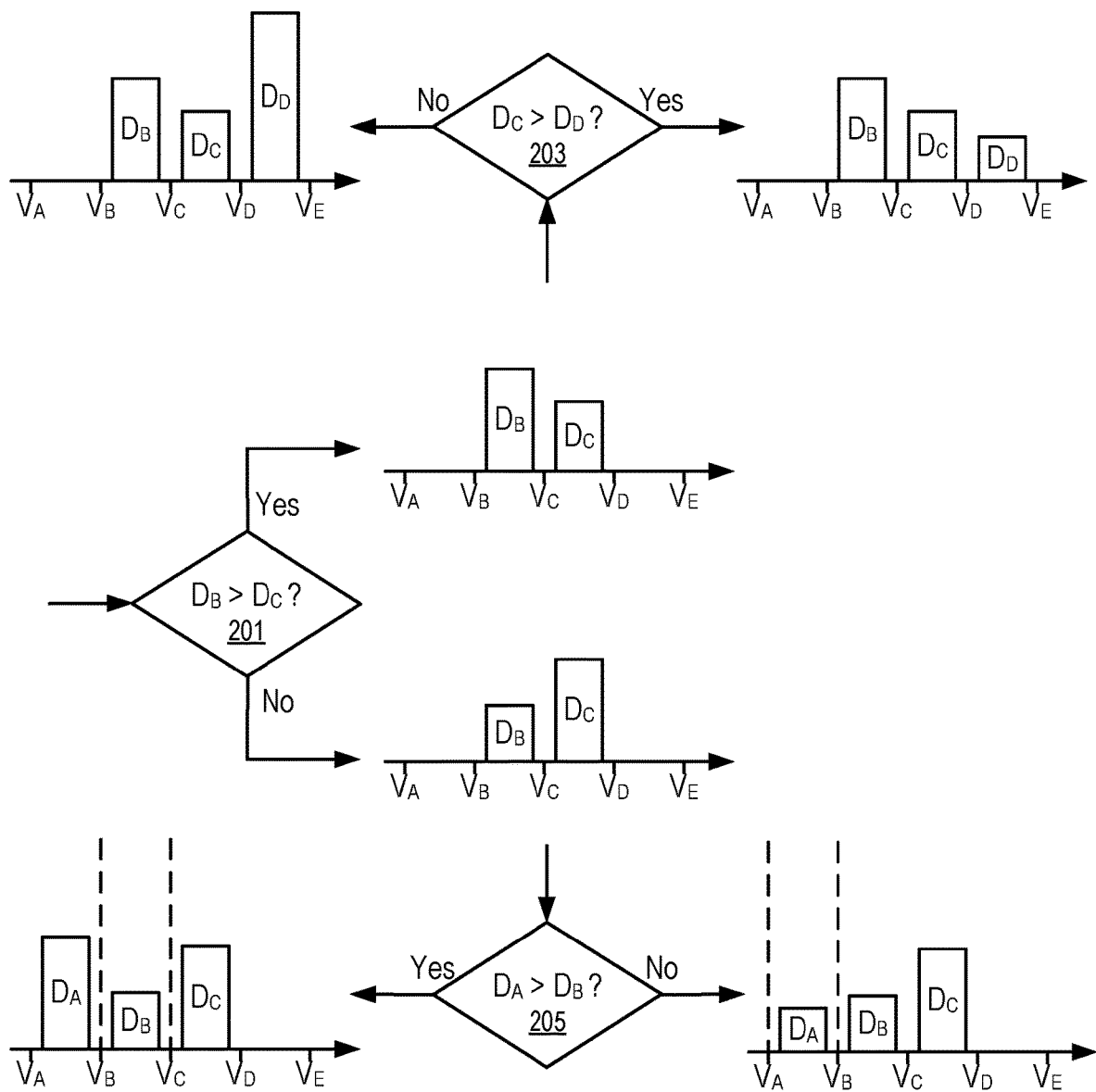
FIGS. 4-6 illustrate a technique to compute an optimized read voltage from count differences according to one embodiment.
Figure 5:
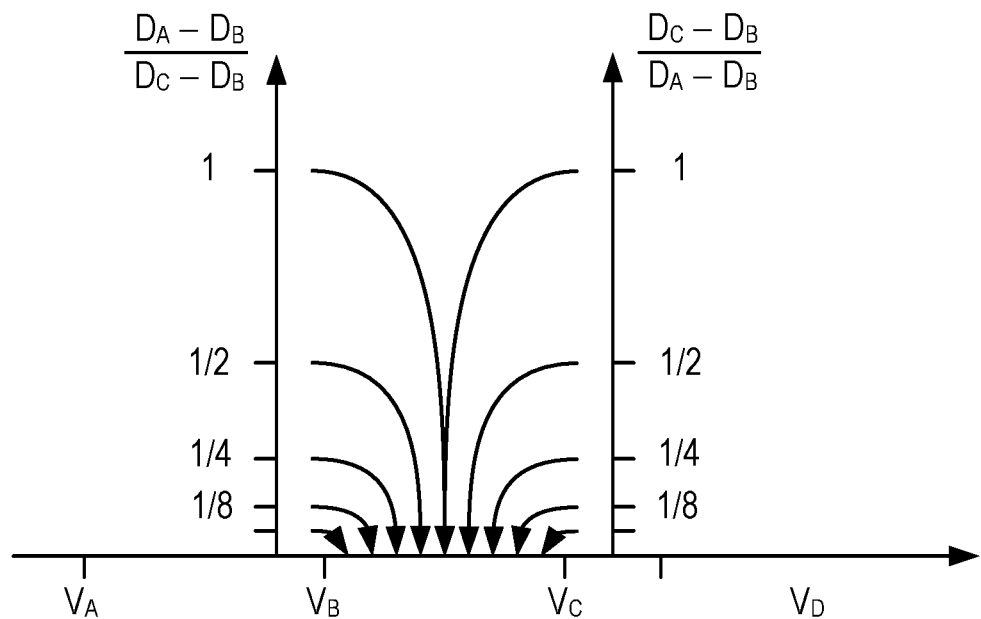
Figure 6:
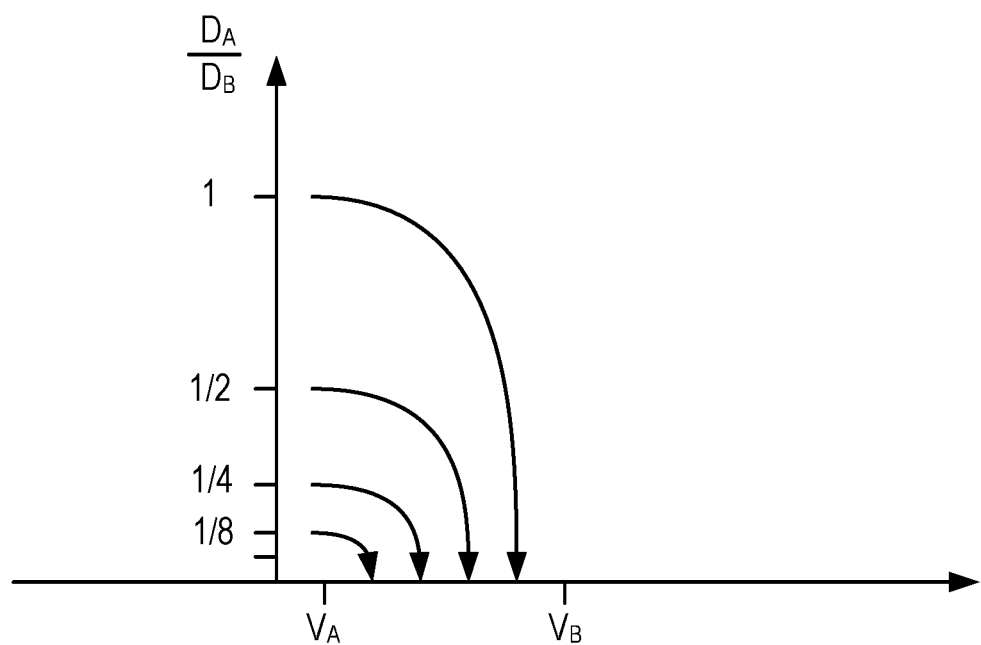

FIGS. 4-6 illustrate a technique to compute an optimized read voltage from count differences according to one embodiment. The technique of FIGS. 4-6 simplifies the computation for calculating the optimized read voltage $V_O$ such that the computation can be implemented using reduced computing power and/or circuitry.

The computation illustrated in FIGS. 4-6 can be performed based on the bit counts and count differences illustrated in FIG. 3 for test voltages $V_A$, $V_B$, $V_C$, $V_D$, and $V_E$.

In FIG. 4, an operation 201 is performed to compare the two center count differences $D_B$ and $D_C$.

If $D_B$ is greater than $D_C$, it can be assumed that a minimal can be found on the higher half of the test voltage region between $V_C$ to $V_E$. Thus, operation 203 is performed to compare the lower one $D_C$ of the two center bit count differences with its other neighbor $D_D$.

If $D_C$ is no greater than its other neighbor $D_D$, $D_C$ is no greater than its neighbors $D_B$ and $D_D$. Thus, it can be inferred that a minimal can be found between the test voltages $V_C$ and $V_D$. Based on a ratio between the differences of $D_C$ from its neighbors $D_B$ and $D_D$, an estimate of the location of the optimized read voltage $V_O$ can be determined using a technique similar to that illustrated in FIG. 5.

If $D_C$ is greater than its other neighbor $D_D$, it can be assumed that a minimal can be in the highest test voltage interval between $V_D$ and $V_E$. Thus, an estimate of the location of the optimized read voltage $V_O$ can be determined using a technique similar to that illustrated in FIG. 6, based on a ratio of count differences $D_D$ and $D_C$ that are closest to the test voltages $V_D$ and $V_E$.

Similarly, if $D_B$ is no greater than $D_C$, it can be assumed that a minimal can be found on the lower half of the test voltage region between $V_A$ to $V_C$. Thus, operation 205 is performed to compare the lower one $D_B$ of the two center bit count differences with its other neighbor $D_A$.

If $D_B$ is less than its other neighbor $D_A$, $D_B$ is no greater than its neighbors $D_A$ and $D_C$. Thus, it can be inferred that a minimal can be found between the test voltages $V_B$ and $V_C$. Based on a ratio between the differences of $D_B$ from its neighbors $D_A$ and $D_C$, an estimate of the location of the optimized read voltage $V_O$ can be determined using a technique illustrated in FIG. 5.

If $D_B$ is no less than its other neighbor $D_A$, it can be assumed that a minimal can be in the lowest test voltage interval between $V_A$ and $V_B$. Thus, an estimate of the location of the optimized read voltage $V_O$ can be determined using a technique illustrated in FIG. 6, based on a ratio of the count differences $D_A$ and $D_B$ that are closest to the test voltages $V_A$ and $V_B$.

FIG. 5 illustrates a technique to estimate the location of the optimized read voltage $V_O$ when a center count difference $D_B$ is no greater than its neighbors $D_A$ and $D_C$.

Since the count difference $D_B$ is the difference of bit counts $C_B$ and $C_C$ at test voltages $V_B$ and $V_C$, the location of the optimized read voltage $V_O$ is estimated to be within the voltage interval or gap between $V_B$ and $V_C$.

When the increases from the center count difference $D_B$ to its neighbors $D_A$ and $D_C$ are substantially equal to each other, the optimized read voltage $V_O$ is estimated at the midpoint between $V_B$ and $V_C$.

The ratio between the increases from the center count difference $D_B$ to its neighbors $D_A$ and $D_C$ can be mapped in a logarithmic scale to a line scale of division between the test voltages $V_B$ and $V_C$.

For example, the ratio $(D_A-D_B)/(D_C-D_B)$ of 1 is mapped to a location of the optimized read voltage at the midpoint between the test voltages $V_B$ and $V_C$.

The ratio $(D_A-D_B)/(D_C-D_B)$ of ½ is mapped to a location of the optimized read voltage at the midpoint between the test voltages $V_B$ and $V_C$ with an offset of a fixed increment towards $V_B$. For example, the increment can be one tenth of the voltage gap between $V_B$ and $V_C$.

Similarly, the ratio $(D_A-D_B)/(D_C-D_B)$ of ¼, ⅛, or 1/16 is mapped to a location of the optimized read voltage at the midpoint between the test voltages $V_B$ and $V_C$ with an offset of two, three, or four increments towards $V_B$. A ratio $(D_A-D_B)/(D_C-D_B)$ smaller than 1/16 can be mapped to a location of the optimized read voltage at $V_B$.

Similarly, the ratio $(D_C-D_B)/(D_A-D_B)$ of ½, ¼, ⅛, or 1/16 is mapped to a location of the optimized read voltage at the midpoint between the test voltages $V_B$ and $V_C$ with an offset of one, two, three, or four increments towards $V_C$. A ratio $(D_C-D_B)/(D_A-D_B)$ smaller than 1/16 can be mapped to a location of the optimized read voltage at $V_C$.

The technique of FIG. 5 can be implemented via setting a coarse estimation of the optimized read voltage at $V_B$ (or $V_C$) and adjusting the coarse estimation through applying the increment according to comparison of the increase $(D_A-D_B)$ of the count difference $D_B$ to the count difference $D_A$ with fractions or multiples of the increase $(D_C-D_B)$ of the count difference $D_B$ to the count difference $D_C$. The fractions or multiples of the increase $(D_C-D_B)$ in a logarithmic scale can be computed through iterative division or multiplication by two, which can be implemented efficiently through bit-wise left shift or right shift operations.

For example, the initial estimate of the optimized voltage $V_O$ can be set at the test voltage $V_B$. The increase $(D_A-D_B)$ can be compared with $(D_C-D_B)/16$, which can be computed through shifting the bits of $(D_C-D_B)$. If $(D_A-D_B)$ is greater than $(D_C-D_B)/16$, the increment of one tenth of the gap between $V_B$ and $V_C$ can be added to the estimate of the optimized voltage $V_O$. Subsequently, $(D_A-D_B)$ is compared to $(D_C-D_B)/8$, which can be calculated by shifting the bits of $(D_C-D_B)/16$. If $(D_A-D_B)$ is greater than $(D_C-D_B)/8$, the same increment of one tenth of the gap between $V_B$ and $V_C$ is further added to the estimation of the optimized voltage $V_O$. Similarly, $(D_A-D_B)$ is compared to $(D_C-D_B)/4$, $(D_C-D_B)/2$, $(D_C-D_B)$, $(D_C-D_B)*2$, $(D_C-D_B)*4$, $(D_C-D_B)*8$, and $(D_C-D_B)*16$ one after another. If $(D_A-D_B)$ is greater than any of these scaled versions of $(D_C-D_B)$ in a comparison, the same increment is added to the estimate. After the series of comparisons, the resulting estimate can be used as the optimized voltage $V_O$.

FIG. 6 illustrates a technique to estimate the location of the optimized read voltage $V_O$ when a side count difference $D_A$ is smaller than its next two count differences $D_B$ and $D_C$, but one of its neighbors has not been measured (e.g., a count difference between the test voltage $V_A$ and a further test voltage that is lower than $V_A$).

Since the count difference $D_A$ is the lowest among count differences $D_A$, $D_B$ and $D_C$, the optimized voltage $V_O$ is estimated to be in the test voltage interval gap corresponding to the count difference $D_A$. Since the count difference $D_A$ is the difference of bit counts $C_A$ and $C_B$ at test voltages $V_A$ and $V_B$, the location of the optimized read voltage $V_O$ is estimated to be within the voltage interval or gap between $V_A$ and $V_B$.

In FIG. 6, the location of the optimized read voltage $V_O$ within the voltage interval or gap between $V_A$ and $V_B$ is based on a ratio of the count differences $D_A$ and $D_B$. The ratio $D_A/D_B$ in a logarithmic scale is mapped to the linear distribution of the optimized read voltage $V_O$ between $V_A$ and $V_B$.

For example, the voltage interval or gap between $V_A$ and $V_B$ can be divided into five equal increments. The initial estimate of the optimized voltage $V_O$ can be set at the test voltage $V_B$. The count difference $D_A$ can be compared to scaled versions of the count difference $D_B$ sequentially, such as $D_B$, $D_B/2$, and $D_B/4$. If the count difference $D_A$ is smaller than any of the scaled versions of the count difference $D_B$ in a comparison, the estimate is reduced by the increment for moving towards the test voltage $V_A$.

FIGS. 4-6 illustrate examples of techniques that can be used to calculate the optimized read voltage $V_O$ when the optimized read voltage $V_O$ is seen to be within the test voltage range $V_A$ to $V_E$. After the optimized read voltage $V_O$ is calculated, the voltage window (e.g., between voltage 181 and 182 illustrated in FIG. 3) for reading soft bit data 173 can be calculated based on a predetermined size for the offsets (e.g., 183 and 184) from the optimized read voltage $V_O$.

However, in some instances, soft bit data 173 read using an alternative voltage window can provide improved results in decoding the hard bit data 177. For example, in some instances, a voltage window having a size that is larger (or smaller) than the standard gap (e.g., 100 mV) pre-defined by the predetermined offsets (e.g., 183 and 183) can be optimal, or better than the standard gap, in generating soft bit data 173 for the decoding of the hard bit data 177. In other instances, a voltage window not centered at the calculated/optimized/calibrated read voltage $V_O$, and thus asymmetric about the calculated/optimized/calibrated read voltage $V_O$, can be optimal, or better than the symmetric voltage window, in generating soft bit data 173 for the decoding of the hard bit data 177, as further discussed below.

Figure 7:
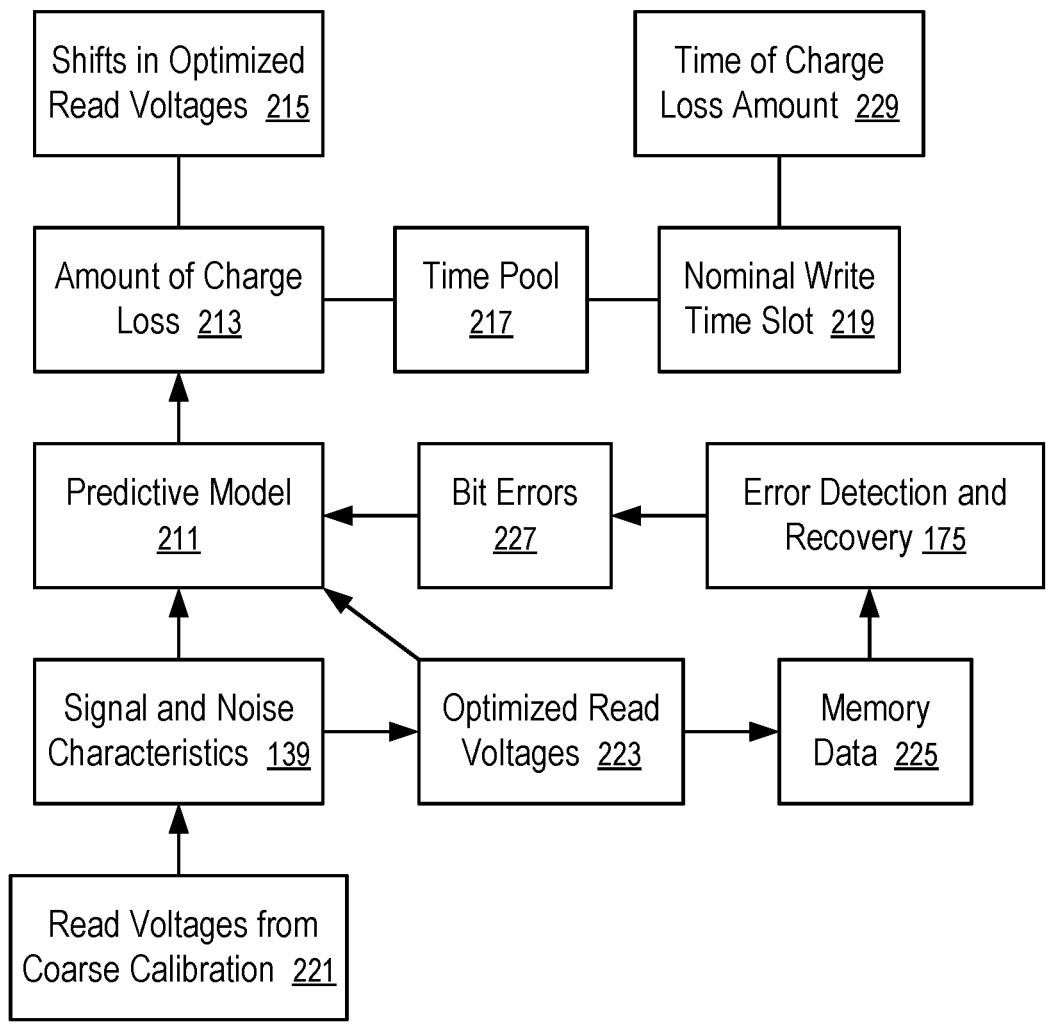
FIG. 7 shows a technique to determine charge loss using signal and noise characteristics of memory cells collected during calibration of the optimized read voltages of the memory cells according to one embodiment.

FIG. 7 shows a technique to determine charge loss using signal and noise characteristics of memory cells collected during calibration of the optimized read voltages of the memory cells according to one embodiment.

When a group of memory cells are configured to each store multiple bits of data, the group of memory cells can be read at a plurality of voltage levels to determine the states of the group of memory cells at the different levels and thus the bits of data stored in each memory cell. An optimized read voltage at each level can be used to determine the state of a memory cell at the level to best determine the bits of data stored in the memory cell.

In FIG. 7, read voltages 221 from a coarse calibration are used as the initial estimates of the optimized read voltages 223 at the different levels. Each of the optimized read voltage can be calibrated via measuring signal and noise characteristics 139 in a test voltage range $V_A$ to $V_E$ centered at a corresponding read voltage 221 from the coarse calibration.

The signal and noise characteristics 139 measured for the determination of an optimized read voltage 223 at a level can include count differences $D_A$ to $D_D$ on a test voltage range $V_A$ to $V_E$, as illustrated in FIG. 3. The read voltage 221 at the level from the coarse calibration 221 can be used as test voltage $V_C$. An optimized read voltage $V_O$ can be determined from the count differences $D_A$ to $D_D$ using the techniques illustrated in FIGS. 3-6. Thus, optimized read voltages 223 can be determined for the different read levels from the read voltages 221 from the coarse calibration and the signal and noise characteristics 139 measured in test voltage ranges configured according to the read voltages 221 from the coarse calibration.

The optimized read voltages 223 can be used to read memory data 225, such as the hard bit data 177 at the optimized read voltages 223 and optionally soft bit data 173 at voltages having an offset from each optimized read voltages (e.g., 181 and 182).

The memory data 225 is decoded via error detection and recovery 175 to generate error-free data that have been previously written into the memory cells. The operation of error detection and recovery 175 identifies a count of the bit errors 227 in the hard bit data 177. The bit errors 227 identifies a bit error rate in the memory data 225.

A predictive model 211 receives the signal and noise characteristics 139, the optimized read voltages 223 and the count of the bit errors 227 as input to output an amount of charge loss 213. The amount of charge loss 213 can be used to update a time pool 217 and/or shifts 215 in optimized read voltages caused by charge loss.

In some implementations, the count differences $D_A$ to $D_D$ measured in the test voltage range $V_A$ to $V_E$ for the calibration of the read voltage $V_O$ at the highest level and the highest optimized read voltage $V_O$ are used in the predictive model 211. In other implementations, signal and noise characteristics 139 measured for other levels of read voltages and the corresponding optimized read voltages are also used in the predictive model 211.

In some implementations, the count of actual bit errors 227 determined in the error detection and recovery 175 is used in predictive model 211 as input. In other implementations, the count of bit errors 227 is estimated/predicted using the signal and noise characteristics 139 (e.g., count differences $D_A$ to $D_D$).

Optionally, the amount of charge loss 213 can be represented by a nominal length of time during which the amount of charge loss 213 can accumulate in a group of memory cells under a predetermined condition (e.g., the memory cells being at a predetermined temperature during the nominal length of time). Thus, the amount of charge loss 213 identifies a nominal time of writing data into the group of memory cells. The nominal write time is the nominal length of time before the measuring of the signal and noise characteristics 139 and can be different from the actual time of writing data into the group of memory cells, because the temperature history between the actual time of write data into the group of memory cell to the measuring of the signal and noise characteristics 139 is generally different from the predetermined temperature.

The group of memory cells having the amount of charge loss 213 can be placed in a time pool 217 having the nominal write time. Another group of memory cell having the same amount of charge loss 213 (or similar amount of charge loss within a threshold in differences) can be assigned to the same time pool 217.

For example, when the difference between the actual times of write data into two groups of memory cells is within a threshold, the two groups of memory cells can be assigned to the same time pool 217. When the two groups of memory cells are read in times within a threshold, the amount of charge loss 213 can be computed using the predictive model 211 for each of the two groups to determine their respective nominal write times. When the nominal write times are substantially different (e.g., more than a threshold), one of the groups can be moved to another time pool that has a nominal write time that is close to the nominal write time of the group being moved. Thus, groups of memory cells can be tracked in time pools based on their similar amounts of charge loss and their similar nominal write times.

The time pool 217 has a nominal write time slot 219 that corresponds to amounts of charge loss (e.g., 213) that are within a predetermined range. Groups of memory cells having their nominal write times falling within the slot 219 are assigned to the time pool 217 for the tracking of their charge loss over time. Each group of memory cells in the time pool 217 approximately has the amount of charge loss 213 at the time 229 of the amount 213 of charge loss being determined from the measured signal and noise characteristics 139. A most recently read/calibrated group in the time pool 217 can have its amount 213 of charge loss calculated using the predictive model to update the time pool 217.

In general, after the time 229 of charge loss amount 213 is determined, memory cells in the time pool 217 can have further charge loss. The additional charge loss can be estimated based on the temperature history between the time 229 and the current time instant. The estimate can be used to update the amount 213 and the time 229 of the time pool 217 such that the shifts 215 in optimized read voltages for the updated amount can be used as a coarse calibration of the read voltages of the time pool 217. The nominal write time slot 219 can also be updated to account for the deviation of the temperature history from the predetermined temperature.

Alternatively, or in combination, the amount 213 can be updated using the predictive model 211 whenever a group in the time pool 217 has its the signal and noise characteristics 139 measured. The slot 219 can be updated according to the amount of charge loss 213 calculated by the predictive model 211; and the time 229 can be updated according to the time of measuring the signal and noise characteristics 139.

Computing the amount 213 of charge loss using the predictive model 211 allows the memory sub-system 110 to track and update time pools (e.g., 217) without a temperature history.

For example, after the memory sub-system 110 is powered off for a period of time and then powered on, the memory sub-system 110 can identify a time pool 217 having a recorded time 229 of charge loss amount 213 that is close to the time of powering off. The memory device 130 then reads a group of memory cells in the time pool 217. The amount of charge loss 213 can be computed for the group calibrated using the signal and noise characteristics 139 to update the nominal write time slot 219 and the time 229 of charge loss amount. Further, the updates to the nominal write time slot 219 and/or the time 229 of charge loss amount can be used to calculate the nominal time duration of powering off and/or the effect of temperate deviation from the predetermined temperature, such that other time pools can also be updated accordingly to account for the duration of powering off and/or the effect of temperate deviation from the predetermined temperature, without requiring the temperature history during the powering off period.

Figure 8:
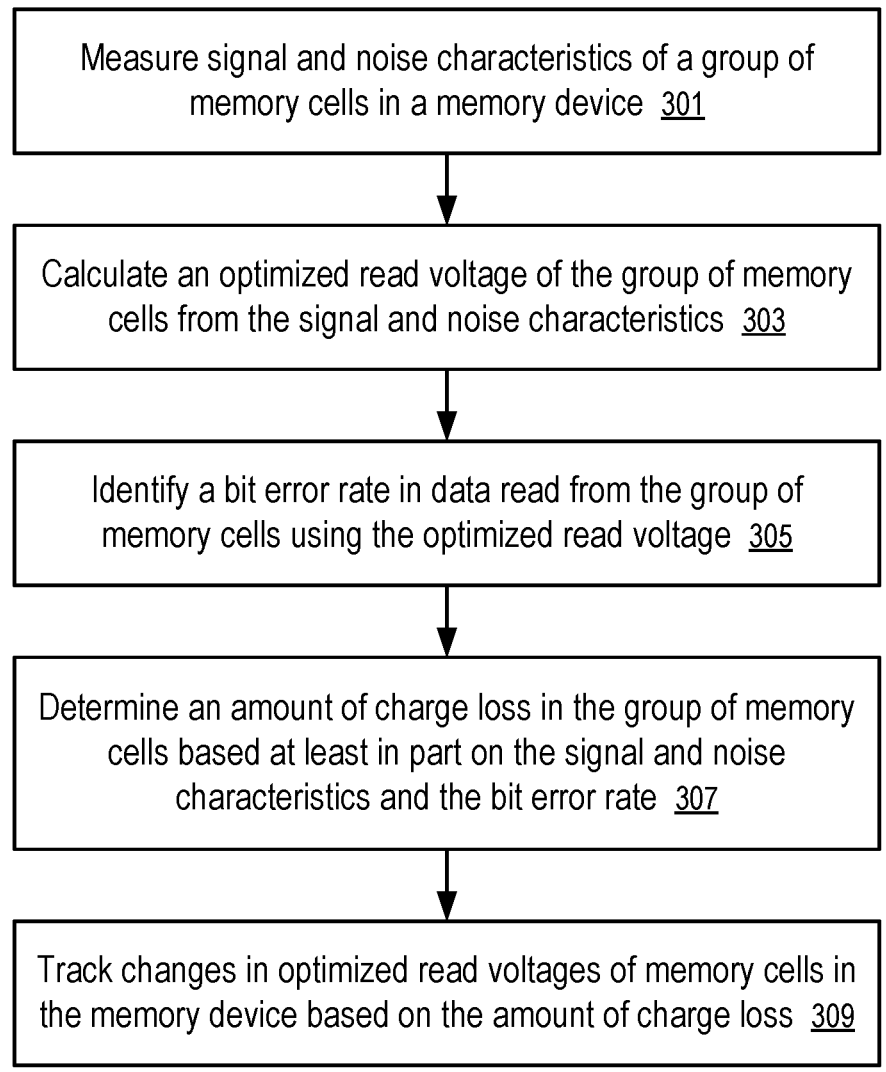
FIG. 8 shows a method to track charge loss according to one embodiment.

FIG. 8 shows a method to track charge loss according to one embodiment. The method of FIG. 8 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 8 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 8 can be implemented in a computing system of FIG. 1 with a memory device of FIG. 2 and signal noise characteristics illustrated in FIG. 3 with some of the operations illustrated in FIGS. 4-7.

At block 301, a memory device 130 measures signal and noise characteristics 139 of a group of memory cells (e.g., group 131 or 133) in the memory device 130.

For example, the memory device 130 can ramp up the read voltage applied on the group of memory cells to $V_C$ to count the number of memory cells that output one (or zero) as the bit count $C_C$ at $V_C$. Then, the memory device 130 can boost modulate the read voltages of four sub-groups in the group to $V_A$, $V_B$, $V_D$ and $V_E$ respectively in parallel to count the number of memory cells that output one (or zero) at $V_A$, $V_B$, $V_D$ and $V_E$ respective. The counts of the sub-groups can be scaled according to the population ratio(s) between sub-groups and the entire group to determine the bit counts $C_A$, $C_B$, $C_D$ and $C_E$ respectively.

Alternatively, the memory device 130 can read the group of memory cells at $V_A$ to $V_E$ sequentially to determine the bit counts $C_A$ to $C_E$.

At block 303, the memory device 130 calculates an optimized read voltage $V_O$ of the group of memory cells (e.g., group 131 or 133) from the signal and noise characteristics 139.

For example, the signal and noise characteristics 139 can include count differences $D_A$ to $D_D$; and the optimized read voltage $V_O$ can be determined using the techniques illustrated in FIGS. 3-7.

At block 305, the memory device 130 and/or the memory sub-system 110 can identify a bit error rate in data 225 read from the group of memory cells (e.g., group 131 or 133) using the optimized read voltage $V_O$.

For example, the bit error rate can be based on a count of bit errors 227 actually identified from error detection and recovery 175 of the memory data 225 read using the optimized read voltages 223.

Alternatively, the bit error rate can be estimated based on the signal and noise characteristics 139 without actually reading the memory data 225 and/or without performing the error detection and recovery 175.

At block 307, the memory device 130 and/or the memory sub-system 110 can determine an amount 213 of charge loss in the group of memory cells (e.g., group 131 or 133) based at least in part on the signal and noise characteristics 139 and the bit error rate.

For example, the amount 211 of charge loss in the group of memory cells can be determined further based on the optimized read voltage $V_O$ of the group of memory cells (e.g., group 131 or 133).

The group of memory cells (e.g., group 131 or 133) can be configured to store multiple bits per memory cell and has a plurality of voltage levels for reading. The signal and noise characteristics 139 used in the predictive model 211 can include the count differences $D_A$ to $D_D$ for the calculation of the optimized read voltage $V_O$ at the highest level among the plurality voltage levels. Optionally, count differences associated with one or more optimized read voltages at other levels can also be used in a predictive model 211 as input to determine the amount 213 of charge loss.

For example, the predictive model 211 can be trained through machine learning to calculate the amount of charge loss 213. Alternatively, the predictive model 211 can be established through a statistical analysis, curve fitting, tree-based classification, etc.

At block 309, the memory device 130 and/or the memory sub-system 110 can track changes (e.g., 215) in optimized read voltages of memory cells in the memory device 130 based on the amount 213 of charge loss.

For example, a time pool 217 can be used to identify a set of memory cell groups having similar amounts of charge loss that are within a predetermined range. Based on the amount 213 of charge loss in the group of memory cells (e.g., group 131 or 133), the memory device 130 and/or the memory sub-system 110 can assign the group (e.g., 131 or 133) to a time pool 217 and/or update an attribute of the time pool 217 that includes the group of memory cells (e.g., group 131 or 133).

For example, the attribute can be configured to identify a range of charge loss amount at the time 229 of the measuring of the signal and noise characteristics 139 of the group of memory cells (e.g., group 131 or 133).

For example, the attribute can be configured to identify shifts 215 of optimized read voltages 223 of memory cells in the pool at the time 229 of the measuring of the signal and noise characteristics 139 of the group of memory cells (e.g., group 131 or 133).

For example, the attribute can be configured to identify a nominal time of writing data in the group of memory cells (e.g., group 131 or 133). Under a predefined condition (e.g., with a predefined temperature of the memory cells), the amount 213 of charge loss can accumulate in the time period from the nominal time to the time of the measuring of the signal and noise characteristics 139 of the group of memory cells (e.g., group 131 or 133). Since the actual temperature history of the group of memory cells (e.g., group 131 and 133) can be different from the predefined temperature, the nominal time of writing data in the group of memory cells (e.g., group 131 or 133) can be different from the actual time of writing data into the group of memory cells (e.g., group 131 or 133).

For example, the memory device 130 and/or the memory sub-system 110 can determine a nominal time duration between the previous update of an attribute of the time pool 217 and the current update of the attribute. The nominal time duration causes, under the predefined condition, charge loss to increase in the group (e.g., 131 or 133) to the amount 213 of charge loss determined based on the signal and noise characteristics 139 of the group of memory cells (e.g., group 131 or 133). The nominal time duration can be different from the actual time duration that causes charge loss to increase to the amount 213 between the previous update and the current update.

The nominal time duration can be used to update the attributes of a plurality of pools that have not been updated during the time period. For examples, when the memory device is powered off during at least a portion of the period between the previous update and the current update, the charge loss that occurs during this period is not tracked and/or updated for the time pools. The nominal time duration determined for the period can be used to update different time pools that are configured to identify different sets of memory cell groups having different ranges of charge loss amount respectively.

Similarly, if the memory device 130 and/or the memory sub-system 110 is idling in a period of time where the time pools are not updated, a nominal time duration can be similarly determined to account for the charge loss accumulated during the period of idle time.

Similarly, when some time pools are not updated for a period of time due to the lack of read/calibration activities during the period of time for the memory cell groups in the pools, such time pools can be similarly updated using one or more nominal time lengths, or use a nominal time length determined for a time group that is updated for a similar period of time.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 9:
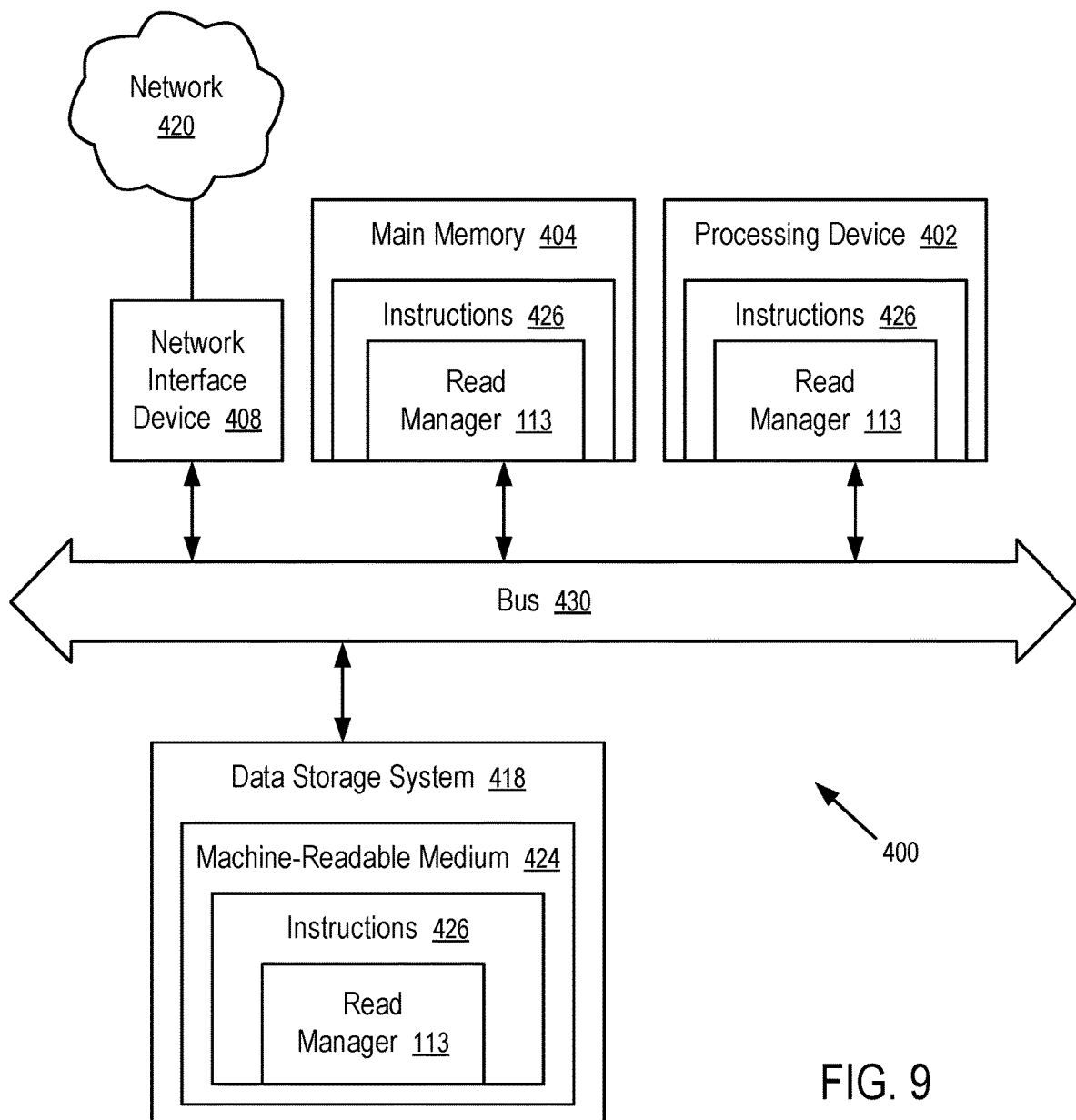
FIG. 9 is a block diagram of an example computer system in which embodiments of the present disclosure can operate.

FIG. 9 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read manager 113 (e.g., to execute instructions to perform operations corresponding to the read manager 113 described with reference to FIGS. 1-8). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read manager 113 (e.g., the read manager 113 described with reference to FIGS. 1-8). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
   memory cells; and
   a logic circuit configured to:
   receive data representative of signal and noise characteristics of the memory cells;
   determine, based on the signal and noise characteristics, a read voltage to read the memory cells; and
   calculate, based at least in part on the signal and noise characteristics, an amount of charge loss in the memory cells; and
   a read circuit configured to apply voltages to the memory cells to determine states of the memory cells under the voltages applied to the memory cells; and
   an integrated circuit package configured to enclose the memory cells, the logic circuit, and the read circuit.

2. The device of claim 1, wherein the logic circuit is further configured to:
   measure, using the read circuit, the signal and noise characteristics of the memory cells; and
   determine, based on the signal and noise characteristics, a bit error rate in data retrievable from the memory cells using the read voltage, wherein the amount of charge loss is determined based at least in part on the bit error rate.

3. The device of claim 2, wherein the logic circuit is further configured to track the read voltage in relation with the amount of charge loss.

4. The device of claim 2, wherein the logic circuit is further configured to track, based at least in part on the read voltage and the amount of charge loss, changes in read voltage in relation with charge loss.

5. The device of claim 2, wherein the signal and noise characteristics are configured to count differences over a plurality of test voltages, each count difference over two adjacent test voltages being a difference between:
   a first count of a subset of the memory cells having a predetermined state when a first one of the adjacent test voltages is applied on the memory cells, and
   a second count of a subset of the memory cells having the predetermined state when a second one of the adjacent test voltages is applied on the memory cells.

6. The device of claim 5, wherein the logic circuit is configured to determine the read voltage based on a local minimum of a distribution of count difference over the plurality of test voltages.

7. The device of claim 6, wherein the logic circuit is configured to calculate the amount of charge loss based on the read voltage.

8. The device of claim 7, wherein the logic circuit is further configured to:
   generate, using the read circuit, first data retrieved from the memory cells using the read voltage;
   decode, using an error detection and recovery technique, the first data, to identify second data stored in the memory cells; and
   count bit errors in the first data identified using the error detection and recovery technique.

9. The device of claim 7, wherein the memory cells are configured to store multiple bits per memory cell and have a plurality of voltage levels for reading; and the read voltage is at a highest level among the plurality of voltage levels.

10. A method, comprising:
    receiving, in a memory device, data representative of signal and noise characteristics of memory cells in the memory device;
    determining, by the memory device based on the signal and noise characteristics, a read voltage;
    determining data stored in the memory device from states of the memory cells subjected to the read voltage;
    calculating, based at least in part on the characteristics, an amount of charge loss in the memory cells; and
    applying a plurality of test voltages to the memory cells to determine states of the memory cells subjected to the test voltages respectively.

11. The method of claim 10, further comprising:
    determining a plurality of counts for the plurality of test voltages respectively, wherein each count in the plurality of counts for a respective test voltage is a number of a subset of the memory cells having a predetermined state when the memory cells are subjected to the respective test voltage; and
    computing count differences between the counts for adjacent ones of the plurality of test voltages, wherein the signal and noise characteristics are configured to identify the count differences.

12. The method of claim 11, further comprising:
    generating first data represented by states of the memory cells when subjected to at least the read voltage;

decoding, using an error detection and recovery technique, the first data, to identify second data stored in the memory cells; and determine, based on the decoding, a bit error rate in the first data to calculate the amount of charge loss.

13. The method of claim 12, further comprising:

tracking the read voltage in relation with the amount of charge loss.

14. The method of claim 12, further comprising:

tracking, based at least in part on the read voltage and the amount of charge loss, changes in read voltages of the memory cells.

15. The method of claim 12, wherein the read voltage is determines based on an estimate of local minimum of the count differences over the plurality of test voltages.

16. The method of claim 15, wherein the memory cells are configured to store multiple bits per memory cell and have a plurality of voltage levels for reading; and the read voltage is at a highest level among the plurality of voltage levels.

17. An apparatus, comprising:

a processing device; and a memory device enclosed within an integrated circuit package and connected to the processing device, the memory device having:

memory cells;

a first circuit operable to apply voltages to the memory cells to determine states of the memory cells subjected to the voltages;

a second circuit configured to:

generate, using the first circuit, data representative of signal and noise characteristics of the memory cells;

determine, based on the signal and noise characteristics, a read voltage of the memory cells; and generate, using the first circuit, first data representative states of the memory cells subject to voltages including the read voltage wherein the apparatus is further configured to:

determine second data stored in the memory cells based on the first data; and calculate, based at least in part on the signal and noise characteristics, an amount of charge loss in the memory cells.

18. The apparatus of claim 17, wherein the first circuit is further configured to:

apply a plurality of test voltages to the memory cells to determine states of the memory cells subjected to the test voltages respectively;

determine a plurality of counts for the plurality of test voltages respectively, wherein each count in the plurality of counts for a respective test voltage is a number of a subset of the memory cells having a predetermined state when the memory cells are subjected to the respective test voltage; and compute count differences between the counts for adjacent ones of the plurality of test voltages;

wherein the signal and noise characteristics are configured to identify the count differences; and wherein the memory device is configured to determine the read voltage based on an estimate of local minimum of the count differences over the plurality of test voltages.

19. The apparatus of claim 18, is further configured to track, based at least in part on the read voltage and the amount of charge loss, changes in read voltages of the memory cells.

20. The apparatus of claim 17, wherein the apparatus is further configured to:

determine second data stored in the memory cells based on the first data; and calculate, based at least in part on the signal and noise characteristics, an amount of charge loss in the memory cells.

* * * * *